United States Patent [19]

Fertin

[11] 3,978,507
[45] Aug. 31, 1976

[54] ELECTROLUMINESCENT DEVICE HAVING LOCALIZED EMISSION

[75] Inventor: Jacques Fertin, Caen, France

[73] Assignee: U.S. Philips Corporation, New York, N.Y.

[22] Filed: May 16, 1975

[21] Appl. No.: 578,168

Related U.S. Application Data

[63] Continuation of Ser. No. 377,891, July 10, 1973, abandoned.

[30] Foreign Application Priority Data

July 13, 1972 France .............................. 72.25492

[52] U.S. Cl. .................................... 357/17; 357/23; 357/16
[51] Int. Cl.² ......................................... H01L 33/00
[58] Field of Search .................. 357/17, 23, 16, 18, 357/19

[56] References Cited
UNITED STATES PATENTS

| | | | |
|---|---|---|---|
| 3,492,548 | 1/1970 | Goodman | 317/235 |
| 3,649,838 | 3/1972 | Phelan, Jr. | 250/211 J |
| 3,714,522 | 1/1973 | Komiya | 317/235 R |

*Primary Examiner*—Martin H. Edlow
*Attorney, Agent, or Firm*—Frank R. Trifari; Leon Nigohosian

[57] ABSTRACT

An electroluminescent semiconductor device having localized emission.

The device comprises a *p–n* diode of which a region is covered with a dielectric layer which itself is covered partly by an electrode polarized with respect to the said region to establish an electric field zone influencing the injected carriers.

Application to the localized control of the emission of an electroluminescent diode.

11 Claims, 4 Drawing Figures

ELECTROLUMINESCENT DEVICE HAVING LOCALIZED EMISSION

This is a continuation of application Ser. No. 377,891, filed July 10, 1973, now abandoned.

BACKGROUND OF THE INVENTION

The present invention relates to a monolithic electroluminescent device of a semiconductor body on which extends a semiconductor region forming a junction with the said body and having electroluminescent properties when minority charge carriers are injected in it, the said body and the said semiconductor layer being provided with electrodes permitting of connecting them to a source of electric energy.

Although the expression light applies in the usual manner to a radiation situated in the visible spectrum, it is to be noted that the luminescence and the light emission considered here relate to the emission of photons of any energy situated or not situated in the visible spectrum.

It is known that the luminescence in electroluminescent diodes is produced by certain recombinations of charge carriers when, for example, minority charge carriers are injected into an adequate semiconductor material by means of a p-n junction polarized in the forward direction. It appears desirable not only to improve the efficiency of said electroluminescent diodes but also to be able to localize and locally control the light emission by simple means which are compatible with the dimensions, the materials and the electric quantities which are of the domain of micro-electronics.

The localisation of the emission permits of considering, for example, monolithic display structures of which the motive to be visualized is obtained by selective excitations of electroluminescent elements.

The efforts to improve the luminous efficiency have up till now mainly related to the reduction of losses by absorption and reflection and to the choice of a material having a high internal luminous efficiency; the control or modulation devices of the light emission have so far been devices for controlling current traversing the diodes for which reason they are comparatively important and necessitate connections of a large sectional area, auxiliary means of high power.

The localisation of the light emission, notably in the materials having an indirect band structure which are transparent to their own radiations, must be obtained by means of opaque zones dividing, for example, a region of an electroluminescent diode in optically distinct elements which are controlled individually by current. Said zones often occupy a considerable surface area.

In French Pat. No. 1,538,071, means are proposed to influence the part of the junctions where the light emission must be eliminated. However, said means only influence the junction and the immediately adjacent zone and they cannot influence the whole luminescent surface of a localized region. Moreover, the lateral electrodes required in said devices to create the necessary electric fields occupy a considerable surface area beside luminescent regions, which diminishes to the same extent the surface area available for the latter.

Structures comprising a dielectric layer and a metal grid applied to a semiconductor diode having already been used to influence the rate of recombination of minority carriers, for example, the structure of the semiconductor device described in the U.S. Pat. No. 3,102,201. In these devices, however, the electric field permitting modulating the light emission covers the whole extent of the junction and uniformly influences in depth the whole extent; the modulation obtained is a modulation in time and said devices do not comprise the possibility of localizing the light emission.

It is mainly the object of the invention to mitigate said drawbacks and said insufficiencies and the invention proposes inter alia to provide an monolithic electroluminescent device comprising a simple means by which the light efficiency and the control and the localisation of the light emission can easily be improved.

BRIEF DESCRIPTION OF THE INVENTION

The invention takes into consideration the fact that the recombinations of charge carriers produced in the mass of a semiconductor can be radiative whereas the recombinations of charge carriers produced near the surface are not radiative. The invention proposes to localize the light emission of a diode by influencing in a selective manner the extent and the position of the part of the semiconductor region where the recombinations are radiative and at the same time the thickness of said part.

According to the invention, the monolithic electroluminescent device constituted by a semiconductor body on which extends a semiconductor region forming a junction with the said body and having electroluminescent properties when minority charge carriers are injected in it, the said body and the said semiconductor layer being provided with electrodes permitting them to be connected to a source of electrical energy, is mainly remarkable in that a dielectric layer extends on the said region parallel to the junction and is itself covered on a part of its surface with a conductive layer which can be polarized by a controllable voltage with respect to the said region, in such manner as to determine in the latter under the dielectric layer at least one localized zone of electric field influencing the carriers injected in the corresponding part of said region.

When the junction between the semiconductor body and the region of the opposite conductivity type is polarized in the forward direction, minority charge carriers are injected in said layer and said injection gives rise to recombinations which, in order to be radiative, must unite under certain conditions and notably be produced in the bulk and not at the surface.

If the conductive layer forming the third electrode and covering a part of the surface of the dielectric layer is positively polarized with respect to the semiconductor region, the injected carriers diffusing in the corresponding part of the latter are conveyed by the electric field towards the surface if it relates to electrons or repelled towards the junction if it relates to holes. In the first case it cannot give rise to radiative recombinations, in the second case the recombinations occur according to the properties of volume of bulk of the material and the internal efficiency of the luminescence is maximum. An inverse phenomenon occurs if the conductive layer is negatively polarized with respect to the semiconductor region. Moreover, the extent to which the influence of the electric field or zone of the electric field makes itself felt is dependent upon the shape and the dimensions of the conductive electrode. The device according to the invention thus permits localizing the light emission by controlling the voltage applied to a localized electrode which is is incorporated in the luminescent device without augmenting its volume. Its manufacture is compatible with all the requirements of microelectronics. It permits, in addition, locally modulating the intensity of the light emission.

BRIEF DESCRIPTION OF THE DRAWINGS

From the following description with reference to the drawings, given by way of example, it will be well understood how the invention can be carried into effect.

Figure 1:
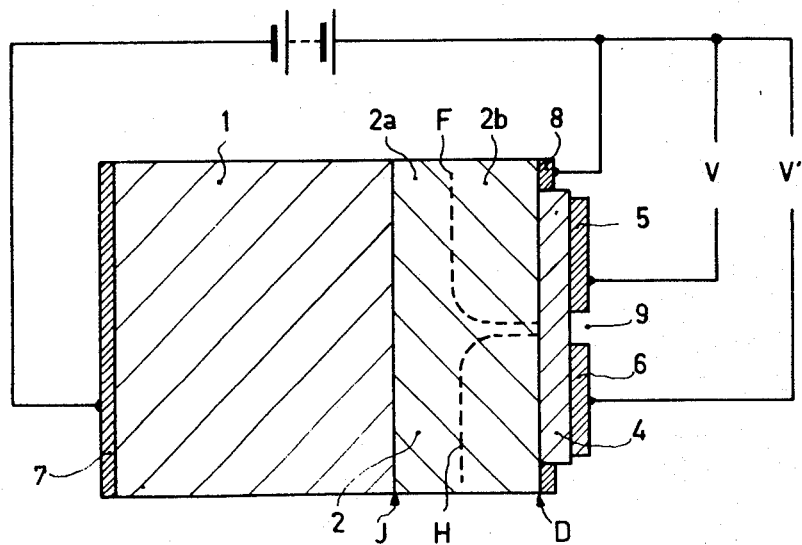
FIG. 1 is a diagrammatic sectional view of the device according to the invention perpendicular to the surface of emission.

The dielectric layer and the conductive layer of the present invention are preferably transparent to the radiation emitted in the semiconductor region. A minimum absorption is obtained by the choice of the materials and notably by giving the conductive layer a very small thickness. The emission of the device may thus occur directly through the dielectric layer and the conductive layer and need not traverse the semiconductor body of which the thickness and the nature could produce a forbidden absorption.

In a variation having an advantage of the same order, the conductive layer is a metal deposit having cavities which are regularly distributed, for example, the layer electrically influences the part of the semiconductor region having shape of a grid with, a small mesh width so that on the other side of the dielectric layer the electric field be substantially uniform throughout the corresponding extent of the semiconductor region.

If the semiconductor body and the semiconductor regions are manufactured from the same material, the junction is a *p-n* junction which can be obtained by the epitaxial deposit on a substrate, or diffusion in a plate, adequate dopings being provided according to the usual methods of manufacturing electroluminescent *p-n*-diodes. The so-called III–V compounds are an example of materials that may be used.

The junction between the body and the semiconductor region may also be a heterojunction between two different materials. For example, the body consists of gallium arsenide and the semiconductor layer consists of a deposit of gallium aluminium arsenide.

In order that the action of the electric field permits, on the one hand, obtaining the complete light extinction on a determined face and on the other hand, a maximum light emission on said same face, it is necessary to give the thickness of the semiconductor region, the impurity concentration of said region, the diffusion length of the carriers in the material of said layer, and the voltage applied to a conductive layer, values corresponding to certain conditions.

The thickness of the semiconductor region must be minimum to absorb the least possible emitted radiation but must also be at least equal to a diffusion length L of the minority carriers injected in order that, in the absence of the electric field, the probability of recombinations is greater in volume than near the surface of the dielectric layer. Advantageously, the thickness of the semiconductor region, at least partly with respect to the conductive layer, is of the order of 1 to 10 diffusion lengths L, for example 3L. Said thickness permits of obtaining, even in the absence of polarisation of the conductive layer, a maximum luminous efficiency.

The concentration of doping impurities, (donor centers and acceptor centers as the case may be) in the material of the semiconductor region must be such that below at least an admissible positive or negative polarisation voltage, the established electric field in the part in question of the semiconductor region penetrates to such an extent as to approach the junction at a distance smaller than the diffusion length of the minority carriers, for example, equal to a third of said length.

It is known that the depth W of the zone of electric field may be evaluated by applying a formula such as $$W = \left( \frac{2 \epsilon V}{q N} \right)^{\frac{1}{2}}.$$

which is valid in most of the cases, $\epsilon$ being the dielectric constant of the material, $V$ the value of the potential difference at the terminals of the zone of the electric field, $q$ the elementary charge of electricity and $N$ the concentration.

The above-explained condition permits obtaining an optimum regulation of the light emission while giving to a sufficient proportion of injected minority carriers, for at least a control voltage admissible for the dielectric, a possibility of reaching (before recombination) the zone of the electric field where they are conveyed towards the surface.

In a preferred embodiment of the invention the semiconductor region has, at least in a part of its thickness, a concentration gradient of recombination centers (donors or acceptors as the case may be) such that the concentration in the vicinity of the dielectric layer be substantially less than in the vicinity of the junction. Said arrangement presents the advantage on the one hand of favouring the recombinations in volume in the vicinity of the junction in a zone where the possibility of radiative recombinations is greatest, on the other hand of augmenting the thickness of the zone in question by the electric field due to the polarized conductive layer.

In an advantageous embodiment, the semiconductor region is formed by two sub-layers: a first sub-layer adjoining the junction with the semiconductor body strongly doped and having a substantially smaller thickness than the diffusion length of the minority carriers, and a second sub-layer adjoining the dielectric layer and having a concentration of doping centers which rapidly decreases towards the latter. A method permitting obtaining this structure in the best conditions consists in manufacturing the semiconductor layer by diffusion and providing in it the second sublayer by an out-diffusion operation.

With the device according to the invention the localisation of the light emission can be obtained in several manners. According to a first embodiment one or several conductive layer parts are provided corresponding to the surfaces which have to be luminous at a given instant and susceptible of being polarized to that end under voltages which are favourable for bulk radiation recombinations, and the remaining part or parts of the dielectric layer are covered by one on several conductive layer parts to which may be applied voltages which are favourable for the recombinations of non-radiative surfaces, the required insulation being produced between the different polarisation surfaces.

With this method, the whole surface of the device with the exception of narrow bands necessary for the insulation may be locally made luminescent or not. The assembly of conductive surfaces may correspond to a single junction, the injection of minority carriers being made so as to be substantially uniform throughout the extent of the junction. In a variation, several junctions are provided each corresponding to one or several conductive surfaces.

According to a second embodiment, one or several conductive layer parts are provided corresponding to the surfaces which have to be luminescent, the remaining part or parts of the dielectric layer are made opaque to the radiations which are susceptible of being emitted by the junction. The opacity of said parts of the dielectric layer is obtained either by the choice of a dielectric material which is opaque itself, or by depositing a layer of an opaque material, for example, a metallic layer. In this case the junction may also be single or divided into several elements.

According to one of the embodiments of a device according to the invention shown in FIG. 1, same is constituted by a semiconductor plate 1 of a first conductivity type, for example, $n$-type, comprising or region 2 of the opposite conductivity type P, a junction J being thus formed between the two parts of the plate. On the region 2 extends a transparent dielectric layer 4 which is itself covered with very thin metallic layers 5 and 6 forming transparent electrodes. A metallic deposit 8 serves to make a contact on the region 2 and another metallic deposit 7 serves to make a contact on the body of the plate 1. A polarisation in the forward direction is applied to the diode formed by the body 1 and the region 2 through the intermediary of contacts 8 and 7. Said polarisation produces the injection of minority carriers through the junction J. The electrons injected in the region 2, which is of the $p$-type, recombine with majority holes in said region and certain of said recombinations are radiative when they occur in volume and not in surface. If a voltage V is applied to the electrode 5, the resulting electric field in the region 2 has an effect dependent upon the polarity and the value of said voltage.

Figure 2:
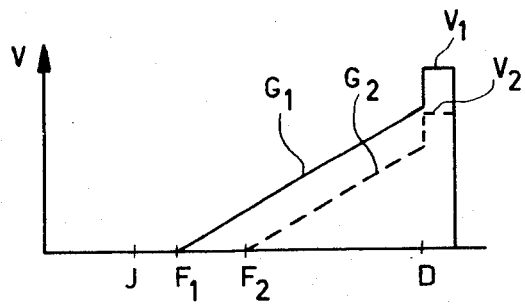
FIG. 2 is a diagram of the electric field distribution according to the thickness of a device.

When the value of the voltage V is augmented the depth of the field zone is proportionally augmented, as is shown in FIG. 2 in which the value of the field is shown as a function of the depth taken perpendicularly to the surface of the dielectric layer 4, with respect to the metallic surface 5.

The field is strong in the dielectric layer 4 up to the interface D. At the interface D, between the dielectric layer 4 and the semiconductor region 2, the field falls to a lower value, then the value of the field decreases linearly until a value zero.

Figure 3:
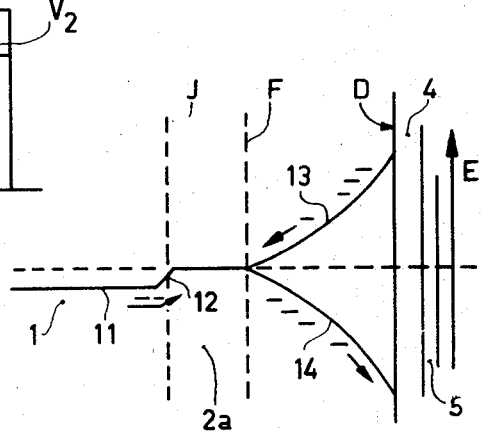
FIG. 3 is a diagram of the energy levels according to the thickness of a device.

It is seen that for a voltage $V_1$ applied to the conductive layer the field is noticeable up to the depth $F_1$, for a voltage lower than an absolute value $V_2$, the field is noticeable up to a depth $F_2$ lower than $F_1$, the gradient being substantially the same in both cases. The limit F (for example at $F_1$ or at $F_2$) at which the field is substantially zero, divides the part in question of the region 2 into two zones, an equipotential zone 2a in which the injected electrons move by diffusion and of which a certain number end by reaching the adjacent zone 2b if the thickness of the zone 2a is lower than their diffusion length L, and the second zone 2b which is a region of the electric field where the electrons are either drawn towards the dielectric layer 4 if the voltage V is positive, or restricted towards the limit F if the voltage V is negative. FIG. 3 indicates the value of the energy levels of the electrons as a function of the distance taken perpendicularly to the surface of the dielectric layer. In the body 1, the level of the conduction band of the material is at 11; on the right-hand side of the junction said level increases to 12 in the same manner as in an electroluminescent $p$-$n$ diode of known type polarized in the forward direction. From the limit F said level follows a substantially exponential curve either according to 13 in the case of a negative voltage V, or according to 14 in the case of a positive voltage V.

According to the polarity of the voltage V, the recombinations occur with a great probability near the surface D if the voltage V is positive and they are not radiative, or near the limit F if the voltage V is negative and the probability of radiative recombinations is maximum.

By causing the value of the voltage V to vary it is thus possible to obtain a continuous variation of the luminous efficiency between a value zero and a maximum value which depends upon the internal quantum efficiency in the region 2a and on the absorption in the region 2b, in the layer 4 and in the electrode 5.

By giving opposite polarities to the voltage V applied to the layer 5 and to the voltage V' applied to the surface 6, one is made luminescent, the other dark: the light emission is localized at the negatively polarized surface. The electric field produced by V which extends up to F has, for example, a repulsive effect on the electrons and the surface 5 appears luminescent. The field produced by V' which extends up to H has an attractive effect of the electrons and the surface 6 may be made dark.

An example of an embodiment of the device according to the preceding description is given hereinafter:

starting material is a plate of gallium arsenide GaAs on which is deposited an epitaxial layer of gallium arsenide phosphide $GaAs_{1+x} P_x$ with $x = 0.4$, doped with tellurium in a concentration of $5 \times 10^{16}$ at/cm$^3$ and having a thickness of 70 microns. In said epitaxial layer is produced a zinc diffusion giving an average concentration of $5 \times 10^{18}$ at/cm$^3$ at a depth of 2 microns. A thermal treatment is carried out producing an out-diffusion of zinc, the surface concentration decreasing to approximately $10^{17}$ at/cm$^3$.

A layer of $SiO_2$ is formed on the surface of the diffused layer. Said dielectric layer has a thickness of 0.15 micron and electrodes are deposited on the one hand on said layer, on the other hand on the substrate plate so as to be able to supply the diode under a voltage of 1.8 volt in the forward direction and to be able to polarize the electrodes with respect to the diode under a controllable voltage of +80 Volt to −10 Volt. In order to preserve a sufficient transparency, the electrodes deposited on the layer are made of chromium in a thickness smaller than 500 A.

Figure 4:
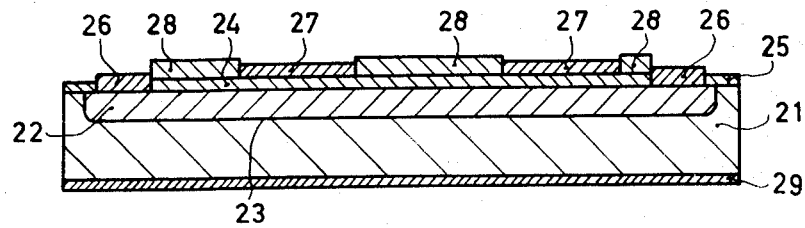
FIG. 4 is a diagrammatic sectional view of another display device according to the invention.

FIG. 4 shows the diagrammatic sectional view of another device according to the invention. It comprises a plate 21 having a diffused region 22 forming a $p$-$n$ junction 23; a dielectric layer 24 covers the surface of the assembly, thus protecting the junction at 25, where it reaches the surface, contacts 26 being provided, through said dielectric layer, on the diffused region 22. A conductive layer 27 covers the dielectric layer 24 according to surfaces the configuration of which is that of the display elements.

The surfaces are, for example, points disposed according to an XY matrix, or bars disposed according to a matrix configuration having seven bars of known type, with decimal point. On the surface of the layer 24 not covered by a metal surface, an insulating and opaque layer 28 is provided which may be opaque by depositing on its surface a thin opaque non-insulating layer. A metallic electrode 29 is deposited on the opposite surface of the plate 21.

The invention may thus be applied in the field of devices for displaying data of the type of point matrix or rod matrix. A display device according to the invention comprises a semiconductor plate of a first conductivity type on which extends a semiconductor region of the opposite type. A transparent dielectric layer covers the said semiconductor region and electrodes in the form of localized transparent metallic layers are provided on the dielectric layer according to the surface corresponding to the elements to be made luminescent. The metallic surfaces are individually connected to voltage sources. The junction between the plate and the semiconductor region may be constantly supplied with current. The surfaces which do not correspond to character elements are covered by the opaque layer. The display device according to the invention has the advantage of having a control in voltage and not a control in current, which permits inter alia separating the function of supplying the power from the control function; the control function may in addition be realized by means of circuits of the type metal-oxide-semiconductor, termed MOS, controlling by voltage the capacities formed by the metallic surfaces, the dielectric layer and the semiconductor layer.

The device also permits realizing an equilibrium between the elements of the one and the same matrix with a view to obtaining a uniform luminescence.

The invention uses luminescent, dielectric and metallic materials which are used in electroluminescent and capacitive devices of known type. The III-V compounds, such as gallium arsenide, gallium arsenide phosphide, gallium phosphide, or gallium aluminum arsenide, are suitable for manufacturing plates and semiconductor layers, the oxides of silicon or aluminum are suitable as dielectrics and very thin layers of tin oxide, indium oxide, or chromium may serve to manufacture transparent electrodes.

What is claimed is:
1. A monolithic electroluminescent device, comprising:
  a semiconductor body;
  b. a semiconductor region disposed at said body and having electrical characteristics different from said body to form a rectifying junction therewith, said region comprising radiative recombination centers so as to have electroluminescent properties when minority charge carriers are injected thereinto;
  c. electrode means provided to said body and said region for electrical connection thereof to a source of electrical energy;
  d. a dielectric layer disposed at and extending on said region parallel to said junction;
  e. a conductive layer disposed at and partially covering a surface of said dielectric layer, said dielectric layer being disposed between said region and said conductive layer; and
  f. electrical potential means for controllably polarizing said conductive layer with respect to said semiconductor region, so as to provide in said region under the dielectric layer at least one localized zone wherein there is provided on electric field influencing the location of carriers injected in a part of said semiconductor region corresponding to said zone.

2. An electroluminescent device as in claim 1, wherein said dielectric layer and said conductive layer are transparent to radiation emitted in said semiconductor region in the direction of said layers.

3. An electroluminescent device as in claim 1, wherein said semiconductor body is one of p and n type and said semiconductor region is the other of said type and said body and said region define said junction which is a p,n junction.

4. An electroluminescent device as in claim 1, wherein said semiconductor body and said semiconductor region consist of different semiconductor materials and define said junction which is a hetero-junction.

5. An electroluminescent device as in claim 1, wherein the thickness of said semiconductor region between said junction and said dielectric layer is about one to 10 times the diffusion lengths of the minority carriers in said region.

6. An electroluminescent device as in claim 1, wherein said electrical potential means comprises means for providing to said conductive layer at least one predetermined polarization voltage whereby the distance between said junction and said electric field zone due to polarization of said conducting layer is at most equal to the diffusion length of the minority carriers in said region.

7. An electroluminescent device as in claim 1, wherein said semiconductor region comprises over at least part of its thickness a concentration gradient of recombination centers, the concentration in the vicinity of said dielectric layer being significantly smaller than in the vicinity of said junction.

8. An electroluminescent device as in claim 1, wherein said semiconductor region is doped and comprises first and second sub-layers, said first sub-layer being highly doped and disposed adjacent said junction and having a thickness smaller than the diffusion length of the minority charge carriers of said region, said second sub-layer being disposed adjacent said dielectric layer and comprising doping centers whose concentration decreases in the direction of said dielectric layer.

9. An electroluminescent device as in claim 1, comprising plural conductive layers electrically insulated from each other and polarized separately and a single said junction that is located opposite all of said conductive layers.

10. An electroluminescent device as in claim 1, comprising plural conductive layers electrically insulated from each other and polarized separately and several said junctions, each of said junction being located opposite at least respective ones of said conductive layer.

11. An electroluminescent device as in claim 1, wherein portions of said dielectric layer uncovered by said conductive layer are opaque to the radiation emitted in the semiconductor region in the direction of said dielectic layer.

* * * * *

UNITED STATES PATENT AND TRADEMARK OFFICE
CERTIFICATE OF CORRECTION

PATENT NO. : 3,978,507
DATED : August 31, 1976
INVENTOR(S) : JACQUES FERTIN

It is certified that error appears in the above-identified patent and that said Letters Patent are hereby corrected as shown below:

Col. 4, line 67, "on" should be --or--.

Col. 6, line 42, "$GaAs_{1+x}$" should be --$GaAs_{1-x}$--.

Signed and Sealed this

Tenth Day of May 1977

[SEAL]

Attest:

RUTH C. MASON
*Attesting Officer*

C. MARSHALL DANN
*Commissioner of Patents and Trademarks*